(12) United States Patent
Anwar et al.

(10) Patent No.: US 8,362,732 B2
(45) Date of Patent: Jan. 29, 2013

(54) MOTOR PHASE WINDING FAULT DETECTION METHOD AND APPARATUS

(75) Inventors: Mohammad N. Anwar, Van Buren Township, MI (US); S. M. N. Hasan, Novi, MI (US); Khwaja M. Rahman, Troy, MI (US); Silva Hiti, Redondo Beach, CA (US); Steven E. Schulz, Torrance, CA (US); Sean E. Gleason, West Bloomfield, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 333 days.

(21) Appl. No.: 12/698,221

(22) Filed: Feb. 2, 2010

(65) Prior Publication Data

US 2011/0187304 A1  Aug. 4, 2011

(51) Int. Cl. *G01R 31/02* (2006.01)

(52) U.S. Cl. ........ 318/490; 318/727; 318/767; 318/807; 318/810; 318/811

(58) Field of Classification Search .................. 318/490, 318/727, 767, 807, 810, 811
See application file for complete search history.

(56) References Cited

U.S. PATENT DOCUMENTS

| | | | |
|---|---|---|---|
| 5,502,361 A * | 3/1996 | Moh et al. | 318/400.03 |
| 5,514,978 A * | 5/1996 | Koegl et al. | 324/750.02 |
| 5,602,761 A * | 2/1997 | Spoerre et al. | 702/179 |
| 5,706,186 A * | 1/1998 | Blasko | 363/41 |
| 5,739,698 A * | 4/1998 | Bowers et al. | 324/765.01 |
| 5,786,708 A * | 7/1998 | Premerlani et al. | 324/765.01 |
| 6,023,417 A * | 2/2000 | Hava et al. | 363/41 |
| 6,064,172 A * | 5/2000 | Kuznetsov | 318/716 |
| 6,128,583 A * | 10/2000 | Dowling | 702/58 |
| 6,172,509 B1 * | 1/2001 | Cash et al. | 324/546 |
| 6,590,362 B2 * | 7/2003 | Parlos et al. | 318/799 |
| RE38,439 E * | 2/2004 | Czerwinski | 363/44 |
| 6,834,256 B2 * | 12/2004 | House et al. | 702/181 |
| 6,989,641 B2 * | 1/2006 | Schulz et al. | 318/139 |
| 7,002,318 B1 * | 2/2006 | Schulz et al. | 318/782 |
| 7,834,573 B2 * | 11/2010 | Lindsey et al. | 318/490 |
| 2003/0067277 A1 * | 4/2003 | Parlos et al. | 318/254 |
| 2004/0239272 A1 * | 12/2004 | Schulz et al. | 318/439 |
| 2005/0237212 A1 * | 10/2005 | Gustafson et al. | 340/679 |
| 2006/0066274 A1 * | 3/2006 | Kolomeitsev | 318/432 |
| 2007/0096680 A1 * | 5/2007 | Schroeder et al. | 318/723 |
| 2008/0100254 A1 * | 5/2008 | Rahman et al. | 318/715 |
| 2008/0258673 A1 * | 10/2008 | Welchko et al. | 318/811 |
| 2010/0109650 A1 * | 5/2010 | Briese et al. | 324/142 |
| 2010/0194324 A1 * | 8/2010 | Kasztenny et al. | 318/490 |
| 2011/0187304 A1 * | 8/2011 | Anwar et al. | 318/490 |
| 2011/0221367 A1 * | 9/2011 | Perisic et al. | 318/400.02 |

\* cited by examiner

*Primary Examiner* — Kawing Chan
(74) *Attorney, Agent, or Firm* — Quinn Law Group, PLLC

(57) ABSTRACT

A method of detecting a phase winding fault in a multi-phase electric machine is executable via a motor controller, and includes measuring feedback signals of the machine, including each phase current, and generating reference phase voltages for each phase. The method includes calculating a predetermined voltage value using the feedback signals and reference phase voltages, and comparing the voltage value to a corresponding threshold to determine the fault. A control action is executed when the voltage value exceeds the corresponding threshold. The voltage value is one or more of: a ratio of a normalized negative sequence voltage to a modulation index, an RMS voltage for each phase, and total harmonic distortion of each phase current. An apparatus detects the fault, and includes a motor controller and an algorithm as set forth above. The apparatus may include a voltage inverter for generating a multi-phase alternating current output for powering the machine.

17 Claims, 3 Drawing Sheets

MOTOR PHASE WINDING FAULT DETECTION METHOD AND APPARATUS

TECHNICAL FIELD

The present invention relates generally to the diagnostics of a poly-phase electric machine, and in particular to a method and apparatus for detecting a fault in a phase winding thereof.

BACKGROUND OF THE INVENTION

Electric power may be produced using poly-phase electric machines, also referred to as motor/generators. Synchronous electric machines may operate at constant speeds and frequencies under steady-state conditions. Synchronous electric machines, e.g., permanent magnet (PM) motors, operate via the principal of electromagnetic induction, with an electromotive force (EMF) generated via an induced flux by relative motion of conductive coils or windings. A synchronous electric machine typically includes a magnetic field structure and an armature. The armature may have a three-phase load winding, which in turn generates an alternating current (AC) EMF. In particular, a stationary or stator portion of a three-phase synchronous electric machine carries the armature winding, which carries a three-phase excitation.

Induction machines are another type of poly-phase electric machine that are also widely used for electric power generation. Like the synchronous electric machine described above, the induction machine or motor includes a stator and rotor, with the stator having a cylindrical core portion carrying windings or coils within its slots. AC is supplied to the stator windings, and a current is thus inducted in the windings of an opposing cylindrical rotor, with the opposing fields acting to rotate the rotor.

Regardless of whether they are used in synchronous-type or in induction-type electric machines, motor phase windings may have minor manufacturing defects between turns or slots, or may develop such defects over time. The defects, although minor, may cause a phase imbalance. A motor controller may perform a stable operation with such defects being present in the phase windings without experiencing any unduly degraded performance. However, over an extended period any incipient defects in the phase windings can lead to a breakdown in the surrounding winding insulation material, which may ultimately lead to other defects or performance issues, such as open and/or shorted phase windings.

SUMMARY OF THE INVENTION

Accordingly, a method and an apparatus are provided herein for detecting a predetermined set of phase windings faults for a poly-phase electric machine. The electric machine tested or diagnosed in accordance with the present invention may have either serial or parallel windings. The fault that is detected may vary with the particular winding configuration. For example, open phase windings, turns, or coils may be detected within a given phase for a parallel winding configuration. Shorted phase windings, turns, or coils may be detected within a given phase or between phases in either a series or a parallel winding configuration.

The method set forth herein may be embodied in algorithmic form and executed via a motor controller to detect a predetermined phase winding fault. Phase impedance imbalance in motor phases introduces a negative sequence in motor currents for open loop control. In the case of field-oriented current control, the controller tries to keep the phase currents symmetrical and balanced up to a certain extent. As a result, a negative sequence is introduced into the various phase voltages.

The algorithm includes measuring a set of motor control values, and then performing a series of calculations and threshold-based comparisons to determine the presence of a predetermined phase winding fault. At least three different calculations may be made, thereby diagnosing the phase winding fault in a multitude of ways.

Within the scope of the invention, the algorithm may be executed to monitor a ratio between negative sequence components of the commanded phase voltages and a modulation index, as explained below. The algorithm may also compare root mean square (RMS) values of three reference phase voltage. Additionally, the algorithm may include steps for monitoring a Total Harmonic Distortion (THD) of the three phase currents. Online diagnostics may be provided via constant monitoring of predetermined threshold fault indexes, i.e., calibrated values that are fixed with respect to operating motor speed or battery voltage.

In particular, a method is provided of detecting a predetermined phase winding fault in a poly-phase electric machine. The method is executable via a motor controller adapted for controlling the electric machine, and includes measuring feedback signals of the electric machine, including at least a corresponding phase current for each of a plurality of phases, and generating reference phase voltages for each phase using the motor controller. The method includes calculating a predetermined voltage value using the feedback signals and reference phase voltages, and then comparing the predetermined voltage value to a corresponding calibrated threshold to determine the presence of the predetermined phase winding fault. The method also includes executing a control action when the predetermined voltage value exceeds the corresponding calibrated threshold. The predetermined voltage value is at least one of: a ratio (F) of a normalized negative sequence voltage ($V_{N\_norm}$) to a modulation index ($M_i$), an RMS voltage ($V_{rms}$) for each phase, and a total harmonic distortion (THD) of each of the phase currents.

An apparatus is provided herein for detecting a predetermined phase winding fault in a poly-phase electric machine, and includes a motor controller and an algorithm as set forth above. The apparatus may include a voltage inverter adapted for inverting a direct current (DC) supply voltage into a multi-phase alternating current (AC) output suitable for powering the electric machine.

The above features and advantages and other features and advantages of the present invention are readily apparent from the following detailed description of the best modes for carrying out the invention when taken in connection with the accompanying drawings.

DESCRIPTION OF THE PREFERRED EMBODIMENT

Figure 1:
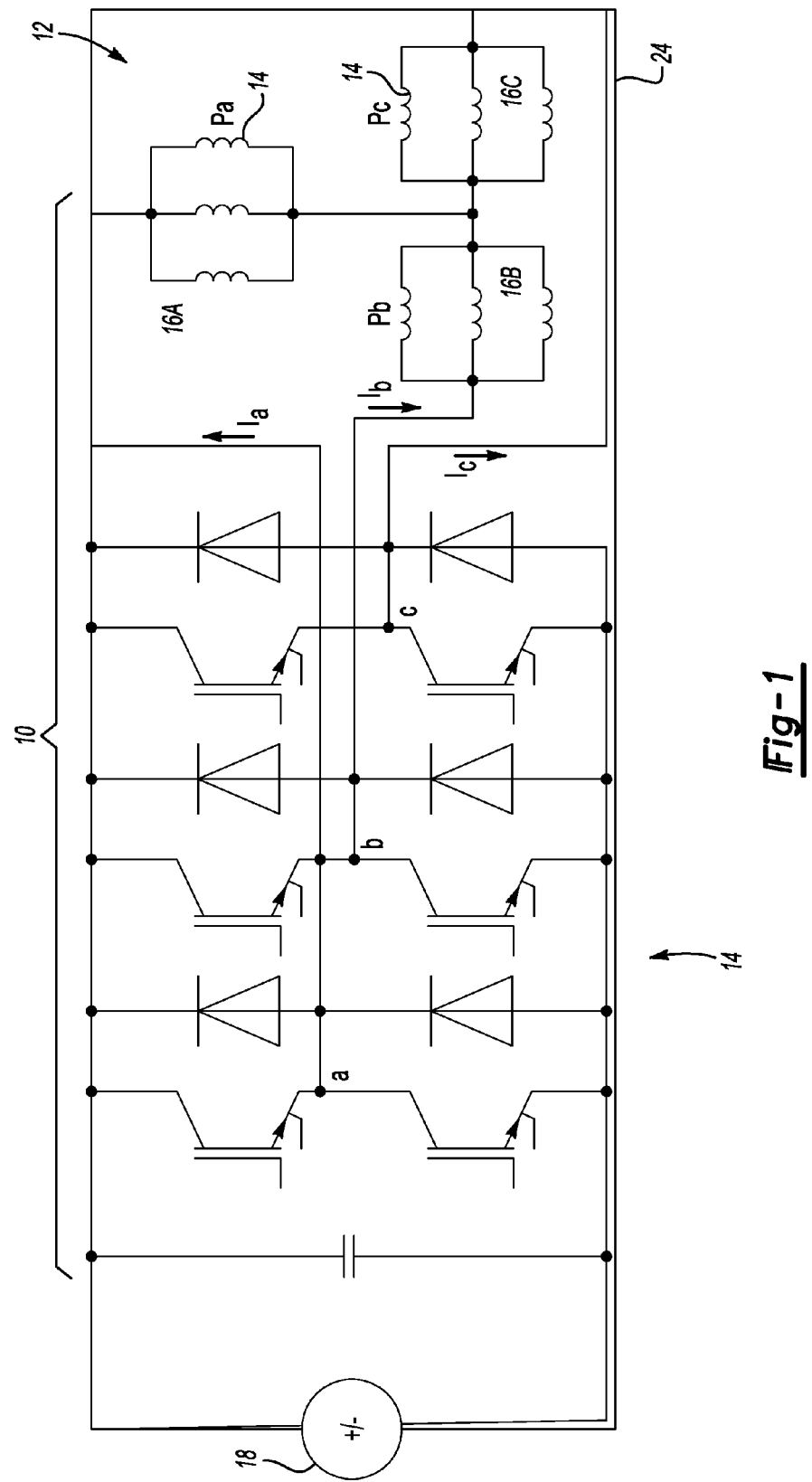
FIG. 1 is a schematic circuit diagram of a three-phase electric machine and a voltage inverter that may be diagnosed in accordance with the present invention.

With reference to the drawings, wherein like reference numbers refer to the same or similar components throughout the several views, and beginning with FIG. 1, an electrical circuit 10 includes a poly-phase electric machine 12, i.e., a synchronous or induction-type motor/generator of the type known in the art, and a power or voltage-source inverter 14. The electric machine 12 includes multiple sets of phase windings, respectively labeled 16A, 16B, and 16C. Each set of phase windings 16A-C includes conductive windings or coils 15. The phase windings 16A, 16B, 16C carry a respective first, second, and third phase, labeled $P_a$, $P_b$, and $P_c$, respectively.

The inverter 14 may be electrically connected to a voltage supply 18, such as a direct current (DC) battery or other DC power supply. The inverter 14 is in communication with and controllable by a motor controller (C) 20 (see FIG. 2) having a phase winding fault detection algorithm 100, as will be described below with reference to FIGS. 2 and 3. The inverter 14 includes various electronic components, e.g., any necessary transistors, capacitors, diodes, etc. for executing the required power inversion functionality.

That is, the inverter is configured to output a multi-phase alternating current (AC) to the electric machine 12. In the embodiment shown in FIG. 1, the electric machine 12 may be configured as a three-phase electric machine, with the three phase currents represented by the arrows $I_a$, $I_b$, and $I_c$. The three phase currents are transmitted to the respective phase windings 16A, 16B, 16C, as is well understood in the art. The particular inverter 14 shown in FIG. 1 may vary in construction without departing from the intended scope of the invention.

Figure 2:
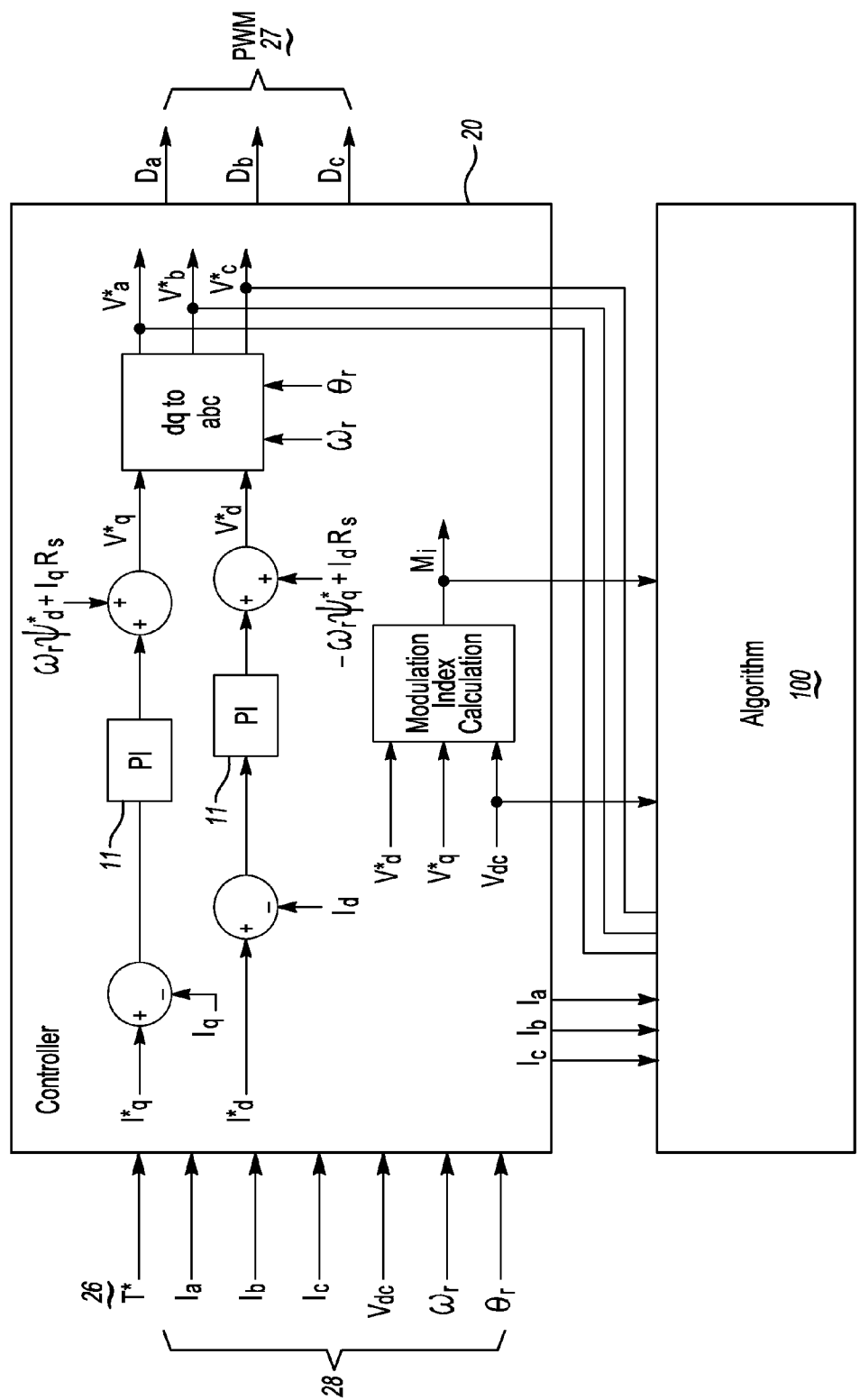
FIG. 2 is a schematic system diagram of a motor controller and an algorithm for detecting a predetermined phase winding fault in the electric machine shown in FIG. 1.

Referring to FIG. 2, the controller 20 may include one or more proportional integral (PI) controllers 11, and is configured to measure and/or receive a torque command signal (T*) 26 and feedback signals 28 from the electric machine 12 and other portions of the circuit 10 of FIG. 1. Feedback signals 28 may include the three phase current ($I_a$, $I_b$, $I_c$), the value of the DC voltage supply 18 of FIG. 1 ($V_{dc}$), and the measured rotor speed and position ($\omega_r$ and $\theta_r$, respectively). A multi-phase electric machine may be mathematically represented as having two axes of magnetic symmetry, i.e., a direct axis (d) and a quadrature axis (q), as will be understood by those of ordinary skill in the art. Other signals processed by the controller 20 may therefore include a direct axis stator flux ($\psi^*_d$) and a quadrature stator flux ($\psi^*_q$) of the electric machine 12 shown in FIG. 1, as well as a stator resistance ($R_s$) thereof. The controller 20 is adapted for processing the signals 26 and 28 to generate reference phase voltages $V^*_a$, $V^*_b$, and $V^*_c$ for control of the electric machine 12.

The controller 20 also uses other conventional AC motor control variables. As will be well understood by those of ordinary skill in the art, voltages and currents may be represented as vectors on a d-q coordinate system. The controller 20 is therefore adapted for determining a current command value $I_d$, $I_q$, i.e., a current supplied to the respective d-axis and q-axis, and a voltage command value $V_d$, $V_q$, i.e., a voltage value applied to the respective d-axis and q-axis, based on the torque command signal (T*) 26. Although not shown in FIGS. 1 and 2 for simplicity, those of ordinary skill in the art will understand that various means exist for detecting or measuring the d-q voltage and current values, including the use of resolvers, current sensors, voltage sensors, etc. The controller 20 ultimately outputs a set of pulse-width modulation (PWM) signals 27 for speed and torque control of the motor or electric machine 12.

Figure 3:
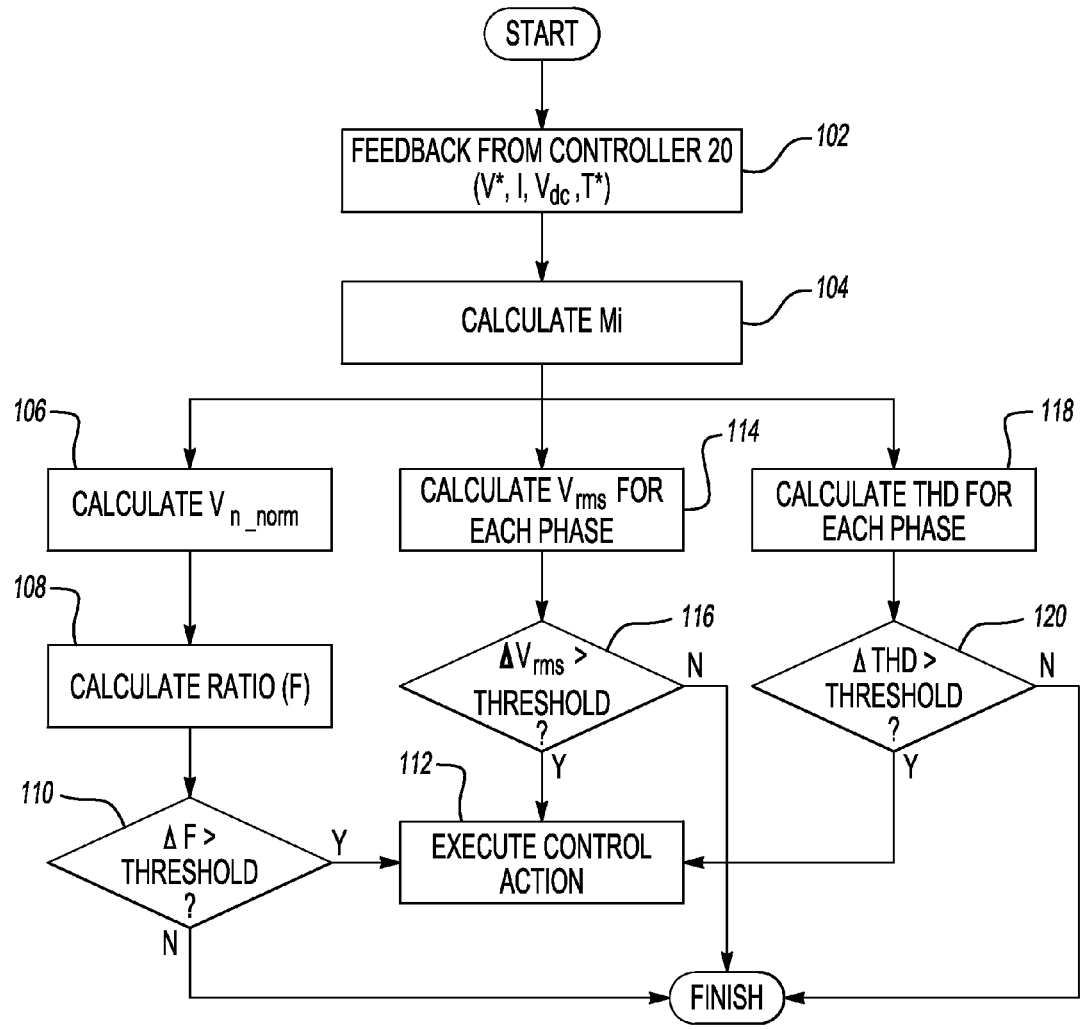
FIG. 3 is a flow chart describing a method or algorithm for detecting a predetermined phase winding fault in the electric machine shown in FIG. 1 using the controller shown in FIG. 2.

Referring to FIG. 3, the method of the present invention may be embodied as the algorithm 100 and automatically executed by the controller 20, with the execution ultimately determining whether any of the phase windings of the electric machine 12 have a predetermined fault as described above. Detection of such a fault may result in the generation or setting of an error/fault flag or diagnostic code signaling for an appropriate corrective action.

The algorithm 100 begins at step 102, the reference phase voltages ($V^*_a$, $V^*_b$, $V^*_c$), a direct current (DC) bus voltage ($V_d$), and phase currents are fed back from controller 20, where in the torque command (T*) 26 and feedback signals 28 are measured or detected. Once these values have been determined and recorded at step 102, the algorithm 100 proceeds to step 104.

At step 104, the algorithm 100 calculates the negative sequence voltage ($V_n$), e.g., by rotating the reference phase voltages ($V^*_a$, $V^*_b$, and $V^*_c$) in the clockwise direction.

$$V_n = \frac{1}{3}(V^*_a + a^2 V^*_b + a V^*_c); \quad a = e^{j2\pi/3},$$

whereas the reference phase voltages are readily available in a counterclockwise synchronous reference frame in the controller 20. A modulation index ($M_i$) is calculated via controller 20 for use by the algorithm 100. The value of the modulation index ($M_i$) in controller 20 may be calculated as:

$$M_i = \sqrt{V_d^2 + V_q^2} \Big/ ((2/\pi)(V_{dc})) = V_s / ((2/\pi)(V_{dc})).$$

The algorithm 100 then proceeds to steps 106, 114, and 118.

At step 106, the algorithm 100 calculates the normalized negative sequence voltage, wherein $V_{n\_norm}=(V_n)/(2^*V_{dc}/3)$. Any stator winding fault will change the phase impedance, and will lead to a voltage unbalance. For a stable current control operation, the reference voltages will be very close to the actual phase voltages. As a result, in the presence of a phase winding fault there will be a negative sequence voltage. This value is normalized as set forth above to generate the normalized value $V_{n\_norm}$. The algorithm 100 then proceeds to step 108.

At step 108, a ratio (F=$V_{n\_norm}/M_i$) is calculated between the normalized negative sequence voltage ($V_{n\_norm}$) and the modulation index ($M_i$), and then stored in memory. The algorithm 100 then proceeds to step 110.

At step 110, the value of the ratio (F) calculated at step 108 is compared to a calibrated threshold, with the result of this comparison used to detect a phase winding fault. The ratio (F) is independent of any fluctuation in a DC bus voltage, i.e., $V_{dc}$, motor operating speed, or torque command (T*) 26. If the value of (F) exceeds a calibrated threshold point, the algorithm 100 proceeds to step 112, otherwise the algorithm is finished, resuming with step 102. Such a calibrated threshold may be selected to avoid any nuisance tripping when no fault is present. The whole fault detection algorithm may be executed in the same loop of the motor controller (fastest loop) where controller 20 will be executed, with loop times varying with switching frequencies. As noted above, all required signals are readily available to the controller 20. All voltages are commanded voltages, and the values of $V_{n\_norm}$ and $M_i$ change with motor speed and torque in such a way that the threshold may be selected easily over the entire range of torque-speed operation.

At step 112, the controller 20 may execute a control action, e.g., setting flag or a diagnostic code, automatically shutting off the electric machine 12 of FIG. 1 or the voltage inverter 14, and/or may take other suitable control actions. As step 112 may be arrived at using different threshold comparisons, i.e., steps 110, 116, and 120, the particular flag or diagnostic code may be customized to reflect the particular calculation and threshold comparison that determined the presence of the fault.

At step 114, the algorithm 100 may calculate the root mean square (RMS) voltage for each of the reference phase voltages $V_a$, $V_b$, and $V_c$. To do so, the following equation may be used:

$$V_{phase\_rms} = \sqrt{(V_1^2 + V_2^2 + \ldots + V_n^2)/n}$$

Once calculated, the algorithm 100 proceeds to step 116.

At step 116, the algorithm 100 compares the difference between phase RMS voltages at each fundamental cycle, which absent a phase winding fault should be near zero. Any significant difference in RMS values ($\Delta V_{rms} = V_{phase\_a\_rms} - V_{phase\_b\_rms}$ or $V_{phase\_a\_rms} - V_{phase\_c\_rms}$) between the three phases may reflect an impedance difference in the three phase windings. When the difference exceeds a calibrated threshold, the algorithm 100 proceeds to step 112, and is otherwise finished.

Within the context of step 116, the commanded phase voltages (normalized) may be stored in the fastest loop or PWM cycle of controller 20 until a slower loop starts. In every slower loop, the data points stored in the fastest loop may be transferred to the slower loop. For example, if the controller 20 has a slower loop of 2 milliseconds and a PWM cycle of 100 microseconds, or a fastest loop of 10 kHz, twenty data points of each phase voltage may be stored in the fastest loop before the slower loop starts. All the data points may be stored in the slower loop until a fundamental cycle of phase voltage is complete. As soon as one fundamental phase cycle is complete, the RMS values of the phase voltages may be calculated by the algorithm 100 in the slower loop, and compared to each other as explained above.

At step 118, the algorithm 100 may calculate a Total Harmonic Distortion (THD) of the phase currents, wherein:

$$THD = \sqrt{(I_{rms}^2 - I_{1,rms}^2)/I_{1,rms}^2}$$

In this approach, the phase current data points may be stored in the fastest loop and transferred to the slower loop as soon as the slower loop begins. The data points over the fundamental cycle may be stored in the slower loop. THD of a phase current may be calculated in the slower loop and compared to the THD at normal condition in every fundamental cycle to check the phase winding fault. Once calculated, the algorithm 100 proceeds to step 120.

At step 120, the value of the THD calculated at step 118 may be compared to a calibrated threshold to determine the presence of a phase winding fault. For example, in the event one or more parallel windings are damaged, the controller 20 may use a flux map and correct value of phase impedance to create a PWM duty cycle. As a result, there will be small amount of distortion in the phase currents. Comparing the THD of a phase currents with the THD of the same phase current in a normal condition in every fundamental cycle may detect a phase winding fault. The distorted phase current may be expressed as a Fourier series as follows:

$$i(t) = I_0 + I_1 \cos(\overline{\omega}_1 t + \alpha_1) + I_2 \cos(\omega_2 t + \alpha_2) + I_3 \cos(\overline{\omega}_3 t + \alpha_3) + \ldots$$

These threshold components may be found for one cycle, and dominant three or four current components may be used to calculate the value of THD. If the THD exceeds the calibrated threshold, the algorithm 100 proceeds to step 112, otherwise the algorithm is finished.

While the best modes for carrying out the invention have been described in detail, those familiar with the art to which this invention relates will recognize various alternative designs and embodiments for practicing the invention within the scope of the appended claims.

The invention claimed is:

1. A method of detecting a phase winding fault in a multi-phase electric machine, the method comprising:
    recording a set of feedback signals of the electric machine, including recording each of: a phase current for each phase, reference phase voltages ($V^*_a$, $V^*_b$, $V^*_c$) for each phase, a direct current (DC) bus voltage ($V_{dc}$), and a torque command (T*);
    calculating a modulation index (Mi) as a function of the DC bus voltage ($V_{dc}$), a direct (d)-axis voltage command of the electric machine, and a quadrature (q)-axis voltage command of the electric machine;
    calculating, via a controller, each of:
        a ratio (F) of a normalized negative sequence voltage ($V_{n\_norm}$) value and the modulation index (Mi);
        root mean square (RMS) voltage (Vrms) for each of the reference phase voltages ($V^*_a$, $V^*_b$, $V^*_c$); and
        a Total Harmonic Distortion (THD) of the phase currents;
    comparing each of the ratio (F), the RMS voltage (Vrms), and the THD to a corresponding calibrated threshold to determine the presence of the phase winding fault; and
    executing a control action with respect to the electric machine when any of the ratio (F), the RMS voltage (Vrms), and the THD exceeds the corresponding calibrated threshold, wherein the control action corresponds to the calibrated threshold that is exceeded.

2. The method of claim 1, wherein the electric machine is one of: a synchronous motor and an induction motor.

3. The method of claim 1, wherein recording a set of feedback signals also includes recording: a speed of the electric machine and an angular position of the electric machine.

4. The method of claim 1, wherein executing a control action includes: setting at least one of a fault flag and the diagnostic code.

5. The method of claim 1, further comprising:
    executing a pulse width modulation (PWM) process on a DC supply voltage using a voltage inverter to thereby generate a multi-phase alternating current (AC) output, and then powering the electric machine using the AC output.

6. The method of claim 1, wherein the phase winding fault is at least one of: an open winding in the electric machine and a shorted winding in the electric machine.

7. A method of detecting a phase winding fault in a three-phase electric motor, comprising:
    measuring a set of feedback signals of the electric motor, including at least a corresponding phase current for each of the three phases of the electric motor;
    generating reference phase voltages for each of the three phases using a motor controller;
    calculating at least one predetermined value using the feedback signals and the reference phase voltages, including calculating a plurality of:
        a ratio (F) of a normalized negative sequence voltage ($V_{n\_norm}$) value and a modulation index (Mi), wherein the modulation index (Mi) is a function of a DC bus voltage, a direct (d)-axis voltage command of the electric motor and a quadrature (q)-axis voltage command of the electric motor;
a root mean square (RMS) voltage (Vrms) for each of the reference phase voltages ($V^*_a$, $V^*_b$, $V^*_c$); and
a Total Harmonic Distortion (THD) of the phase currents;
comparing, via the motor controller, the at least one predetermined value to a corresponding calibrated threshold to determine the presence of the phase winding fault; and
setting a diagnostic code using the motor controller when the predetermined voltage value exceeds the calibrated threshold, wherein the diagnostic code corresponds to the calibrated threshold that is exceeded.

8. The method of claim 7, wherein measuring a set of feedback signals also includes measuring: a direct current (DC) supply voltage as the DC bus voltage, a speed of the electric motor, and an angular position of the electric motor.

9. The method of claim 7, further comprising automatically turning off the electric motor when the phase winding fault is detected.

10. The method of claim 7, further comprising executing a pulse width modulation (PWM) process on the DC bus voltage using a voltage inverter to generate a three-phase alternating current (AC) output, and then powering the electric motor via the three-phase AC output.

11. The method of claim 7, wherein the predetermined phase winding fault is at least one of: an open winding of the electric motor and a shorted winding of the electric motor.

12. An apparatus for detecting a predetermined phase winding fault in a multi-phase electric machine, the apparatus comprising:
a motor controller in electrical communication with the electric machine, wherein the motor controller is configured to measure a set of feedback signals of the electric machine, including at least a corresponding phase current for each phase thereof; and wherein the motor controller is configured to:
receive feedback signals from the electric machine;
generate reference phase voltages for each phase of the electric machine;
calculate a plurality of predetermined values using the feedback signals and reference phase voltages;
compare each of the predetermined values to a corresponding calibrated threshold to determine the presence of the predetermined phase winding fault; and
execute a control action via the motor controller when the predetermined value exceeds the calibrated threshold, wherein the control action includes diagnosing the phase winding fault in a manner that corresponds to the exceeded threshold;
wherein the plurality of predetermined values are: a ratio (F) of a normalized negative sequence voltage ($V_{n\_norm}$) to a modulation index ($M_i$), an RMS voltage ($V_{rms}$) for each phase, and a total harmonic distortion (THD) of each of the phase currents, wherein the modulation index (Mi) is function of a DC bus voltage, a direct (d)-axis voltage command of the electric machine, and a quadrature (q)-axis voltage command of the electric machine.

13. The apparatus of claim 12, further comprising a voltage inverter configured to invert the DC bus voltage into a multi-phase alternating current (AC) output suitable for powering the electric machine, wherein the inverter is in communication with and controllable by the motor controller.

14. The apparatus of claim 13, wherein the voltage inverter uses pulse-width modulation (PWM) of the DC bus voltage to generate a three-phase AC output as the multi-phase AC output, and wherein the electric machine is one of a three-phase synchronous motor and a three-phase induction motor.

15. The apparatus of claim 12, wherein the feedback signals include a motor torque command, the DC bus voltage, a speed of the electric machine, and an angular position of the electric machine.

16. The apparatus of claim 12, wherein the control action includes setting at least one of: a fault flag and a diagnostic code.

17. The apparatus of claim 12, wherein the predetermined phase winding fault is one of: an open winding and a shorted winding of the electric machine.

* * * * *